United States Patent [19]

Vitali

[11] 4,103,335
[45] Jul. 25, 1978

[54] LINE SYNCHRONIZED INTERRUPT GENERATOR

[75] Inventor: Joseph D. Vitali, Tulsa, Okla.

[73] Assignee: Standard Oil Company (Indiana), Chicago, Ill.

[21] Appl. No.: 763,744

[22] Filed: Jan. 28, 1977

[51] Int. Cl.² .............................................. H03K 5/00
[52] U.S. Cl. ........................... 364/900; 328/20; 328/28; 307/269; 307/261; 307/63
[58] Field of Search ... 364/200 MS File, 900 MS File; 328/20, 28; 307/269, 261, 63

[56] References Cited

U.S. PATENT DOCUMENTS

| | | | |
|---|---|---|---|
| 3,509,472 | 4/1970 | Arlen | 328/63 |
| 3,808,543 | 4/1974 | Mueller | 328/38 |
| 3,898,589 | 8/1975 | Tustison | 332/9 R |
| 3,965,430 | 6/1976 | Brandt | 328/20 |

*Primary Examiner*—Gareth D. Shaw
*Assistant Examiner*—C. T. Bartz
*Attorney, Agent, or Firm*—Albert C. Metrailer; Arthur McIlroy

[57] ABSTRACT

An interrupt generator comprising an optical coupler and a number of cascaded bidirectional one shots. The input of the optical coupler is coupled to AC powerlines which provide power to a computer. The output of the optical coupler is an isolated square wave signal having the same frequency as the AC powerline. This output is used to trigger the input of the first one shot in a string of one shots. The first one shot has an output which triggers the inputs of a second one shot, which, in turn, triggers the inputs of the third, etc. The one-shot outputs provide a series of even multiples of the AC powerline frequency each synchronized with the powerline. A selected output of one of the one shots is passed through a buffer to the computer as an indication of the optimum time to sample data in a real time data acquisition system.

5 Claims, 1 Drawing Figure

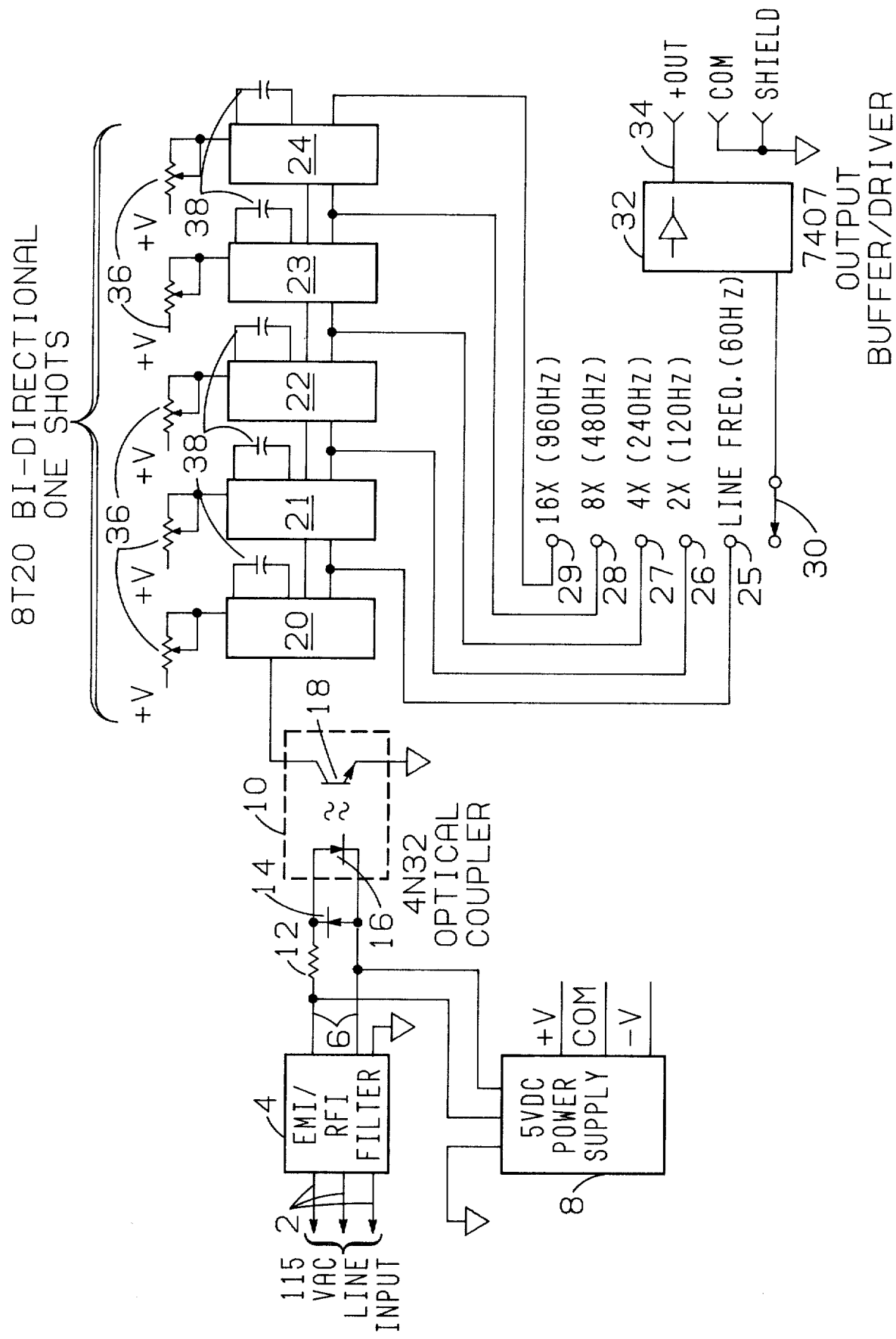

LINE SYNCHRONIZED INTERRUPT GENERATOR

BACKGROUND OF THE INVENTION

This invention relates to the general field of digital computers and more particularly to apparatus for generating signals for controlling the exact time of data acquisition by a digital computer in a real time data acquistion system.

While digital computers have long been used for the purpose of processing recorded data, their use in the field of real time data acquisition is relatively new. In a real time data acquisition system, a digital computer is wired directly to a remote piece of laboratory test equipment, such as a voltmeter or pressure detector. In this way, the laboratory equipment output is read directly into the computer memory without the time delay and possible error caused by human intervention.

A source of errors has been recognized in such real time data acquisition systems. Since relatively long conducting lines must be connected between the laboratory equipment and the computer, electrical noise from a variety of sources, primarily associated with powerlines, is picked up by the signal-conducting lines. Powerline noise which is picked up in this way tends to obscure the signal, or, in other words, to reduce the signal-to-noise ratio. The accuracy of the system is thus degraded, and the information recorded by the computer may be unreliable. It has been recognized that the noise levels on such signal lines are at a minimum at time periods corresponding to the zero crossings of the AC powerlines and harmonics of the AC powerline frequency. Thus, the signal-to-noise ratio of acquired information on such lines is a maximum when the data is acquired precisely at the zero crossing time occurrences.

Based on the above information, attempts have been made to synchronize computer data acquisition with the zero crossings of the powerline and harmonics of the powerline frequency. In general, these attempts have involved connecting analog comparators to the line frequency signal to give zero crossing information for the line frequency itself. Zero crossings of harmonics of the line frequency were obtained by using analog resonant circuits having resonant frequencies at the desired harmonics, driving the resonant circuits with the line frequency signal, and using analog comparators to detect the zero crossings of the resonant frequency signals. Several problems have arisen in practice with such circuits. It is difficult for the analog comparator to accurately identify a zero crossing where the input signal is a sine wave, such as the line signal itself, or the output of a resonant circuit. The results of this type of inaccuracy cause both jitter and an average error in the timing of the zero crossing indication. Such an error is magnified in the case of the higher harmonics due to further errors introduced by the resonant circuits. The analog resonant circuits used at these low frequencies, below 1000 Hz, are unstable due to component drift, particularly in capacitors. Such component drift can be compensated for by use of adjustable elements but need for continual readjustment is undesirable.

There has been a need, therefore, for a highly accurate, stable, and reliable apparatus for generating indications of the zero crossings of powerline signal and harmonics thereof.

SUMMARY OF THE INVENTION

Accordingly, an object of the present invention is to provide an improved line-synchronized interrupt generator.

Another object of the present invention is to provide a line-synchronized interrupt generator comprised essentially of only stable and accurate digital components.

Another object of the present invention is to provide a simple and easily adjusted line-synchronized interrupt generator.

These and other objects of the present invention are achieved by providing a line-synchronized interrupt generator comprising essentially an optical coupler and a cascaded series of bidirectional one shots. The optical coupler has an input coupled to the power supply line, and an output coupled to the input of a first one shot. The coupler accurately and reliably converts the sine wave power signal to a square wave signal at powerline frequency. In response to the signal from the optical coupler, the first one shot generates a square wave output at double line frequency. This output is coupled to the input of a second one shot which generates an output at four times line frequency. Additional harmonics are generated by other one shots in the same way. The desired interrupt frequency is then coupled to a computer as an indication of the precise times at which information should be acquired for the optimum signal-to-noise ratio.

BRIEF DESCRIPTION OF THE DRAWING

The present invention may be more fully understood by reading the following detailed description with reference to the accompanying drawing, which is a combination block and circuit diagram of a line-synchronized interrupt generator according to the present invention.

DESCRIPTION OF THE PREFERRED EMBODIMENT

The preferred embodiment will be described with reference to the attached drawing. The interrupt generator, according to the present invention, draws both its operating power and its synchronizing information from a standard 115-volt AC line input, which is also used to supply power to a digital computer in a data acquisition system. Three inputs 2 are illustrated as connected to the AC line to correspond to the standard power wiring system in which a third wire is used as a safety or case ground. As is standard practice in many electronic systems, an electromagnetic interference and radiofrequency interference filter 4 is included in the apparatus to remove noise signals above the line frequency from this power input line. AC power output lines 6 from filter 4 are connected both to a modular 5-volt DC power supply 8 and to an optical coupler or isolator 10. Power supply 8 is used to supply the ±5-volt DC level required to operate the solid-state digital components comprising the rest of the interrupt generator. A series resistor 12 is placed in the power supply lines 6 connected to the input of coupler 10 to limit the currents through an external diode 14 and light-emitting diode 16 which is part of coupler 10. Optical coupler 10 is a commercial component comprising the light-emitting diode 16 and a lightsensing transistor 18. The optical coupler 10 used in the preferred embodiment is sold under the part number 4N32 by Motorola Semiconductor Products, Inc., P.O. Box 20912, Phoenix, Ariz. In this device, transistor 18 is actually a darlington type of device. Optical couplers, such as coupler 10, are designed primarily to provide AC coupling from an input connected to the light-emitting diode 16 to the outputs connected to transistor 18, with essentially no electrical connection between input and output and no feedback of signal from output to input. In this embodiment, the electrical isolation characteristics of coupler 10 are used to advantage, but the primary importance of coupler 18 is its use as a zero crossing detector for the powerline signal. In this digital application, transistor 18 provides essentially a short circuit at the output of coupler 10 whenever light-emitting diode 16 is conducting current and emitting light and an open circuit otherwise. By the simple arrangement of the preferred embodiment, diode 16 emits light during one-half cycle of the powerline signal and not during the other half. When diode 16 is reversed biased, the external diode 14 conducts current and limits the reverse bias voltage across diode 16 to protect it. In practice, the output of coupler 10 is highly stable, accurate, and reliable in providing a square wave representation of the powerline signal.

The output of coupler 10 is connected to trigger input of a one shot 20, which is the first of a cascaded series of bidirectional one shots, including one shots 20 through 24. The one shots used in the preferred embodiment are sold commercially under the part number 8T20 by Signetics Corporation, 811 East Arques Avenue, Sunnyvale, Calif. In the preferred embodiment, one shot 20 is triggered in only one polarity of the square wave output of coupler 10 so that its output is equal to the input line frequency, which, in the United States is a standard 60 Hz. The 60-Hz square wave output of one shot 20 is coupled to the trigger input of one shot 21, which triggers on both polarities of input transitions to provide an output having a frequency of double its input. Likewise, the output of one shot 21 is coupled to the trigger input of one shot 22, which, in turn, generates a double frequency output. In similar fashion, one shots 23 and 24 provide additional higher frequency square wave signals all synchronized with the output of coupler 10, which, in turn, is synchronized with the original powerline signal. Although it is not essential, the use of one shot 20 at line frequency is preferred for several reasons. It insures that the output impedances will be equal no matter which frequency is selected. It also allows precise adjustment of the pulse width of the 60-Hz signal to guarantee a square wave at 60 Hz.

The outputs of one shots 20 through 24 are coupled to terminals 25 through 29, respectively, of a single-pole, 6-position switch 30. The wiper of switch 30 is connected to the input of a non-inverting buffer 32. Switch 30 allows the selection of 60 Hz, 120 Hz, 240 Hz, 480 Hz, or 960 Hz interrupt frequencies by connecting to the appropriate outputs of one shots 20 through 24. Buffer 32 simply provides a higher power level output to output 34 of the line-synchronized interrupt generator. Buffer 32 used in the preferred embodiment is sold commercially under the part number SN7407 by Texas Instruments, Inc., P.O. Box 5012, Dallas, Tex. Line 34 is connected to the digital computer in a data acquisition system to indicate the precise times at which the computer should acquire data to provide the highest signal-to-noise ratio.

In practice, the line-synchronized interrupt generator, according to the present invention is assembled on a single, small printed circuit board, which plugs into a standard computer equipment rack. The interrupt generator thus becomes, in essence, a part of the computer which is used to acquire data on a real time basis. Potentiometers 36 and capacitors 38 connected to one shots 20 through 24 determine the actual pulse width generated by each one shot. The potentiometers 36 are adjusted initially when the devices are assembled to provide exact square wave outputs from each one shot. Testing has shown that the devices are very stable so that essentially no adjustment is needed in the field. The stability is due in part to inherent stability of the one shots and in part to the fact that capacitors 38 are stable ceramic-type devices.

Although the present invention has been shown and illustrated in terms of specific apparatus, it is apparent that changes and modifications may be made within the spirit of the present invention as defined by the appended claims.

I claim:

1. A line-synchronized interrupt generator comprising:
    a solid state optical coupler having an input coupled to a powerline which supplies power to a computer, and an output for providing a square wave signal synchronized with the powerline signal; and
    a first bidirectional one shot coupled to the output of said optical coupler and having an output for providing a square wave signal at twice the powerline frequency and synchronized with the powerline signal.

2. A line-synchronized interrupt generator according to claim 1 further including one or more additional bidirectional one shots coupled in cascade to the output of said first one shot to provide additional square wave outputs synchronized with the line signal, each additional square wave output having a frequency twice as high as its input frequency.

3. A line-synchronized interrupt generator according to claim 1 further including switching means for selectively coupling the output of said optical coupler and said first one shot to a computer as indications of the exact times at which the computer may acquire data from remote equipment at the highest signal-to-noise ratio.

4. Apparatus for generating indications of the zero crossings of an alternating current powerline signal and a harmonic of said powerline signal comprising
    a solid state optical coupler having an input coupled to the powerline and an output for providing a square wave signal synchronized with said powerline signal, and
    a first bidirectional one shot coupled to the output of the optical coupler and having an output for providing a square wave signal at twice the powerline frequency and synchronized with the powerline signal.

5. Apparatus according to claim 4 further including one or more additional bidirectional one shots coupled in cascade to the output of said first one shot to provide additional square wave outputs synchronized with the line signal and each additional square wave output having a frequency twice as high as its input frequency.

* * * * *